United States Patent
Hu (10) Patent No.: US 12,364,072 B2
(45) Date of Patent: Jul. 15, 2025

(54) FLEXIBLE DOUBLE-SIDED DISPLAY SCREEN AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Xiaobo Hu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/620,673

(22) PCT Filed: Dec. 9, 2021

(86) PCT No.: PCT/CN2021/136690
§ 371 (c)(1),
(2) Date: Dec. 17, 2021

(87) PCT Pub. No.: WO2023/097727
PCT Pub. Date: Jun. 8, 2023

(65) Prior Publication Data
US 2024/0047628 A1    Feb. 8, 2024

(30) Foreign Application Priority Data
Nov. 30, 2021 (CN) .......................... 202111447366.X (51) Int. Cl.
H10H 20/852  (2025.01)
H01L 25/075  (2006.01)
(Continued)

(52) U.S. Cl.
CPC ......... H10H 20/852 (2025.01); H01L 25/167 (2013.01); H10H 20/0362 (2025.01)

(58) Field of Classification Search
CPC . H01L 33/52; H01L 25/167; H01L 2933/005; H01L 2933/0033;
(Continued)

(56) References Cited

U.S. PATENT DOCUMENTS

2004/0075628 A1    4/2004  Chien et al.
2008/0315761 A1*  12/2008  Kobayashi .......... H10K 50/856
                                                       313/504
(Continued)

FOREIGN PATENT DOCUMENTS

CN    103337478 A    10/2013
CN    104022123 A    9/2014
(Continued)

OTHER PUBLICATIONS

Machine Translation of CN 107221608 A (Year: 2017).*
(Continued)

*Primary Examiner* — Yara B Green
*Assistant Examiner* — Akhee Sarker-Nag
(74) *Attorney, Agent, or Firm* — PV IP PC; Wei Te Chung (57) ABSTRACT

A flexible double-sided display screen and a manufacturing method thereof are provided. The flexible double-sided display screen can be manufactured by the manufacturing method of the flexible double-sided display screen: by attaching two second support plates onto encapsulation layers of two display devices, respectively, then stripping off first support plates of the two display devices to expose flexible substrates thereof, thereby rigid second support plates being able to support the two display devices to conveniently attach the flexible substrates of the two display (Continued)

devices together, and at last, stripping off the two second support plates of the two display devices. The flexible double-sided display screen does not have the first support plates and second support plates, thereby having flexibility, and a thickness and costs of the flexible double-sided display screen can be reduced.

16 Claims, 4 Drawing Sheets

(51) Int. Cl.

| | | |
|---|---|---|
| *H01L 25/16* | (2023.01) | |
| *H05K 1/18* | (2006.01) | |
| *H10H 20/01* | (2025.01) | |
| *H10K 59/122* | (2023.01) | |
| *H10K 59/123* | (2023.01) | |
| *H10K 59/126* | (2023.01) | |
| *H10K 59/128* | (2023.01) | |
| *H10K 59/176* | (2023.01) | |
| *H10K 71/50* | (2023.01) | |
| *H10K 71/80* | (2023.01) | |
| *H10K 77/10* | (2023.01) | |

(58) Field of Classification Search
CPC .............. H01L 25/0753; H10K 59/122; H10K 59/126; H10K 59/128; H10K 59/176; H10K 71/50; H10K 71/80; H10K 77/111; H10K 59/123; H05K 1/00; H05K 2201/10106; H05K 1/189; H10H 20/852; H10H 20/0362; H10H 20/036

See application file for complete search history.

(56) References Cited

U.S. PATENT DOCUMENTS

| | | | |
|---|---|---|---|
| 2011/0012140 A1 | 1/2011 | Grabowski | |
| 2018/0182982 A1* | 6/2018 | Tang | H10K 77/111 |
| 2019/0237452 A1* | 8/2019 | Kuo | H10H 20/855 |
| 2021/0242248 A1* | 8/2021 | Chen | H01L 25/0753 |
| 2021/0358896 A1* | 11/2021 | Lee | H01L 24/26 |
| 2022/0052036 A1* | 2/2022 | Xiao | H01L 27/156 |
| 2024/0038945 A1* | 2/2024 | Cheng | H10H 20/841 |

FOREIGN PATENT DOCUMENTS

| | | | |
|---|---|---|---|
| CN | 106206991 A | | 12/2016 |
| CN | 107221608 A | * | 9/2017 |
| CN | 107331687 A | | 11/2017 |
| CN | 109119453 A | | 1/2019 |
| CN | 110634923 A | | 12/2019 |
| CN | 211506999 U | | 9/2020 |
| CN | 113129774 A | | 7/2021 |
| WO | 2020037857 A1 | | 2/2020 |
| WO | 2021120112 A1 | | 6/2021 |

OTHER PUBLICATIONS

CN 107221608 A English Translation (Year: 2017).*
International Search Report in International application No. PCT/CN2021/136690, mailed on Aug. 25, 2022.
Written Opinion of the International Search Authority in International application No. PCT/CN2021/136690, mailed on Aug. 25, 2022.
Chinese Office Action issued in corresponding Chinese Patent Application No. 202111447366.X dated Oct. 18, 2022, pp. 1-8.

* cited by examiner

FLEXIBLE DOUBLE-SIDED DISPLAY SCREEN AND MANUFACTURING METHOD THEREOF

FIELD OF INVENTION

The present disclosure relates to the field of display screen technologies, and more particularly, to a flexible double-sided display screen and a manufacturing method thereof.

BACKGROUND OF INVENTION

When conventional display screens are applied to commercial display fields, double-sided display is required in some scenarios to allow people to see displayed images not only from the front of display screens but also from the back of the display screens. Double-sided display screens are usually formed by attaching two display screens together in current technology. However, double-sided display screens of this solution have a higher cost and a thicker thickness, and do not have flexibility, so that they are unable to adapt to trends of thinness and flexibility.

Technical problem: the present disclosure provides a flexible double-sided display screen and a manufacturing method thereof to solve a problem of double-sided display screens having a thicker thickness and no flexibility in current technology.

SUMMARY OF INVENTION

In a first aspect, an embodiment of the present disclosure provides a manufacturing method of a flexible double-sided display screen, which includes following steps:
  providing two display devices, wherein, each of the two display devices includes a first support plate, a flexible substrate disposed on the first support plate, a light-emitting device layer disposed on the flexible substrate, and an encapsulation layer disposed on the flexible substrate and the light-emitting device layer;
  attaching two second support plates onto encapsulation layers of the two display devices, respectively;
  stripping off first support plates of the two display devices;
  attaching flexible substrates of the two display devices together; and
  stripping off the two second support plates of the two display devices.

In the manufacturing method of the flexible double-sided display screen, before attaching the flexible substrates of the two display devices together, the manufacturing method further includes following steps:
  manufacturing at least one alignment mark on each of the two second support plates; and
  aligning the at least one alignment mark of the two second support plates.

In the manufacturing method of the flexible double-sided display screen, the light-emitting device layer includes a plurality of mini-light-emitting diode chips.

In the manufacturing method of the flexible double-sided display screen, the mini-light-emitting diode chips of the two display devices are mirror symmetry to each other.

In the manufacturing method of the flexible double-sided display screen, the light-emitting device layer includes a plurality of sub light-emitting devices disposed at intervals, and each of the sub light-emitting devices includes an anode layer, a cathode layer, and an organic light-emitting material layer disposed between the anode layer and the cathode layer.

In the manufacturing method of the flexible double-sided display screen, the sub light-emitting devices of the two display devices are mirror symmetry to each other.

In the manufacturing method of the flexible double-sided display screen, the step of attaching the flexible substrates of the two display devices together includes following steps:
  attaching the flexible substrates of the two display devices together by an optical adhesive.

In the manufacturing method of the flexible double-sided display screen, the step of stripping off the first support plates of the two display devices includes a following step:
  stripping off the first support plates of the two display devices by a laser lift-off process.

In the manufacturing method of the flexible double-sided display screen, the step of stripping off the two second support plates of the two display devices includes a following step:
  stripping off the two second support plates of the two display devices by a laser lift-off process.

In a second aspect, an embodiment of the present disclosure further provides the flexible double-sided display screen, which includes two display devices;
  wherein, each of the two display devices includes a flexible substrate, a light-emitting device layer disposed on the flexible substrate, and an encapsulation layer disposed on the flexible substrate and the light-emitting device layer; and
  flexible substrates of the two display devices are attached to each other.

In a third aspect, an embodiment of the present disclosure further provides a manufacturing method of a flexible double-sided display screen, which includes following steps:
  providing two display devices, wherein, each of the two display devices includes a first support plate, a flexible substrate disposed on the first support plate, a light-emitting device layer disposed on the flexible substrate, and an encapsulation layer disposed on the flexible substrate and the light-emitting device layer;
  attaching two second support plates onto encapsulation layers of the two display devices, respectively;
  stripping off first support plates of the two display devices by a laser lift-off process;
  attaching flexible substrates of the two display devices together; and
  stripping off the two second support plates of the two display devices by the laser lift-off process.

In the manufacturing method of the flexible double-sided display screen, before attaching the flexible substrates of the two display devices together, the manufacturing method further comprises following steps:
  manufacturing at least one alignment mark on each of the two second support plates; and
  aligning the at least one alignment mark of the two second support plates.

In the manufacturing method of the flexible double-sided display screen, the light-emitting device layer comprises a plurality of mini-light-emitting diode chips.

In the manufacturing method of the flexible double-sided display screen, the mini-light-emitting diode chips of the two display devices are mirror symmetry to each other.

In the manufacturing method of the flexible double-sided display screen, the flexible substrates further include a plurality of light-shielding layers disposed directly under the mini-light-emitting diode chips.

In the manufacturing method of the flexible double-sided display screen, the light-emitting device layer comprises a plurality of sub light-emitting devices disposed at intervals, and each of the sub light-emitting devices comprises an anode layer, a cathode layer, and an organic light-emitting material layer disposed between the anode layer and the cathode layer.

In the manufacturing method of the flexible double-sided display screen, the sub light-emitting devices of the two display devices are mirror symmetry to each other.

In the manufacturing method of the flexible double-sided display screen, the flexible substrates further include a plurality of light-shielding layers disposed directly under the sub light-emitting devices.

Beneficial effects: compared to current technology, the flexible double-sided display screen can be manufactured by the manufacturing method of the flexible double-sided display screen provided in the present disclosure: by attaching the two second support plates onto the encapsulation layers of the two display devices, respectively, then stripping off the first support plates of the two display devices to expose the flexible substrates thereof, thereby rigid second support plates being able to support the two display devices to conveniently attach the flexible substrates of the two display devices together, and at last, stripping off the two second support plates of the two display devices. The flexible double-sided display screen does not have the first support plates and second support plates, thereby having flexibility, and a thickness and costs of the flexible double-sided display screen can be reduced.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

Referring to FIGS. 1 to 5, an embodiment of the present disclosure provides a manufacturing method of a flexible double-sided display screen, which includes following steps.

Figure 1:
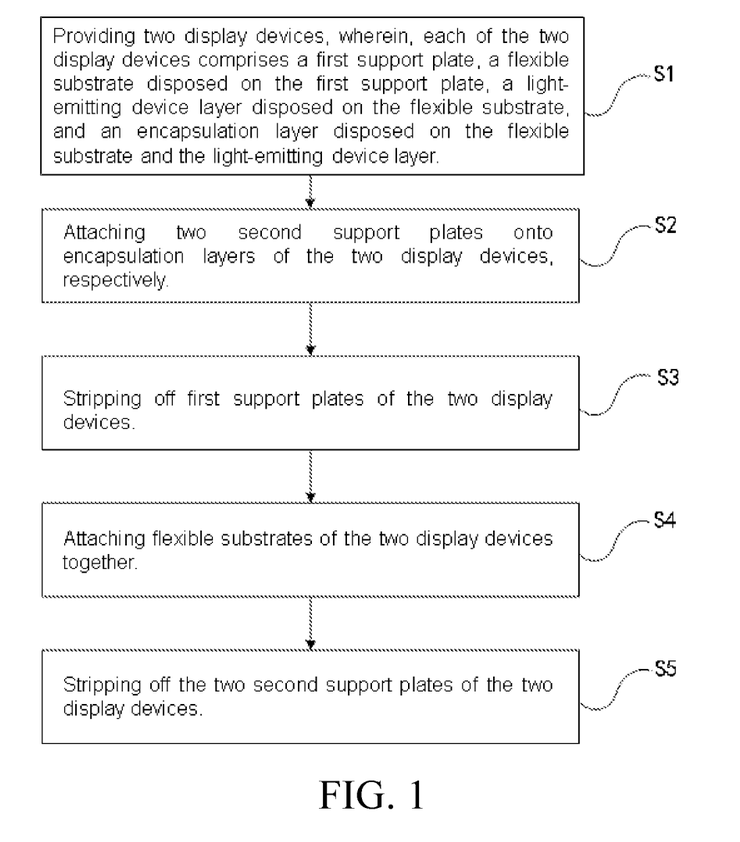
FIG. 1 is a flowchart of a manufacturing method of a flexible double-sided display screen according to an embodiment of the present disclosure.

Step S1: providing two display devices 1, wherein, each of the two display devices 1 includes a first support plate 11, a flexible substrate 12 disposed on the first support plate 11, a light-emitting device layer 13 disposed on the flexible substrate 12, and an encapsulation layer 14 disposed on the flexible substrate 12 and the light-emitting device layer 13.

Step S2: attaching two second support plates 15 onto encapsulation layers 14 of the two display devices 1, respectively.

Step S3: stripping off first support plates 11 of the two display devices 1.

Step S4: attaching flexible substrates 12 of the two display devices 1 together.

Step S5: stripping off the two second support plates 15 of the two display devices 1.

It should be noted that light-emitting device layers 13 of the two display devices 1 provided in the step S1 are already manufactured, and the two display devices 1 can be subsequently bonded to each other to form the flexible double-sided display screen. Before attaching the two display devices 1 together, rigid first support plates 11 can support the two display devices 1 to conveniently attach the two second support plates 15 onto the encapsulation layers 14 of the two display devices 1, respectively. Then the first support plates 11 of the two display devices 1 are stripped off to expose the flexible substrates 12 thereof, thereby rigid second support plates 15 being able to support the two display devices 1 to conveniently attach the flexible substrates 12 of the two display devices 1 together, and at last, the two second support plates 15 of the two display devices 1 are stripped off to form the flexible double-sided display screen. The flexible double-sided display screen does not have the first support plates 11 and second support plates 15, thereby having flexibility, and a thickness and costs of the flexible double-sided display screen can be reduced.

In addition, a light-emitting direction of each display device 1 is a direction away from the flexible substrate 12, that is, each display device 1 emits light to the direction away from the flexible substrate 12. The present disclosure can allow the light-emitting direction of the two display devices 1 to face away each other by attaching the flexible substrates 12 of the two display devices 1 together, thereby realizing double-sided display.

The embodiment of the present disclosure does not specifically limit applications of the flexible double-sided display screen, which can be any product or component having display functions, such as a television, a laptop, a tablet, a wearable display device (such as a smart bracelet, a smart watch, etc.), a mobile phone, a virtual reality device, an augmented reality equipment, a vehicle display, an advertising light box, etc.

In some embodiments, a material of the first support plates 11 and the second support plates 15 may be glass. Of course, the first support plates 11 and the second support plates 15 may also be other rigid materials, which are not limited in the present disclosure.

In some embodiments, a material of the encapsulation layers 14 is silica gel, which allows the encapsulation layers 14 to have high light-transmittance and good ability to isolate water and oxygen, thereby being able to effectively prevent external water vapor from intruding the light-emitting device layers 13, and improving a service life of the light-emitting device layers 13. Meanwhile, a transparent material would not cause the light-emitting device layers 13 to lose light.

In some embodiments, the flexible substrate 12 may include a flexible substrate and a thin film transistor circuit disposed on the flexible substrate. The flexible substrate may be a polydimethylsiloxane substrate or a polyimide substrate, thereby allowing the flexible substrate to have good flexibility and allowing the display devices 1 to realize flexible bending. Of course, the flexible substrate may also be other materials, which are not limited in the present disclosure.

The thin film transistor circuit may include a plurality of thin film transistor units, and the thin film transistor units include P-type or N-type low temperature polysilicon thin film transistors. The thin film transistor circuit also includes a plurality of scanning lines and single-ended signal lines extending along a row direction and a plurality of data lines extending along a column direction, wherein, the scanning lines and the data lines are disposed crosswise and insulated from each other. Each of the thin film transistor units include a gate electrode, a source electrode, and a drain electrode, wherein, the gate electrode of the thin film transistor units is connected to the scanning lines, the source electrode of the thin film transistor units is connected to the data lines, and the single-ended signal lines are insulated from the scanning lines and the data lines. The thin film transistor units may be connected to the light-emitting device layers 13 to control the light-emitting device layers 13.

In some embodiments, before attaching the flexible substrates 12 of the two display devices 1 together in the step S4, the manufacturing method further includes following steps: manufacturing at least one alignment mark on each of the two second support plates 15; and aligning the at least one alignment mark of the two second support plates 15. Therefore, fitting accuracy of the flexible substrates 12 of the two display devices 1 could be improved, thereby allowing display areas of the two display devices 1 to be correspondingly mirror symmetry to each other and also allowing non-display areas of the two display devices 1 to be correspondingly mirror symmetry to each other, thereby improving a transmittance of the flexible double-sided display screen.

Figure 2:
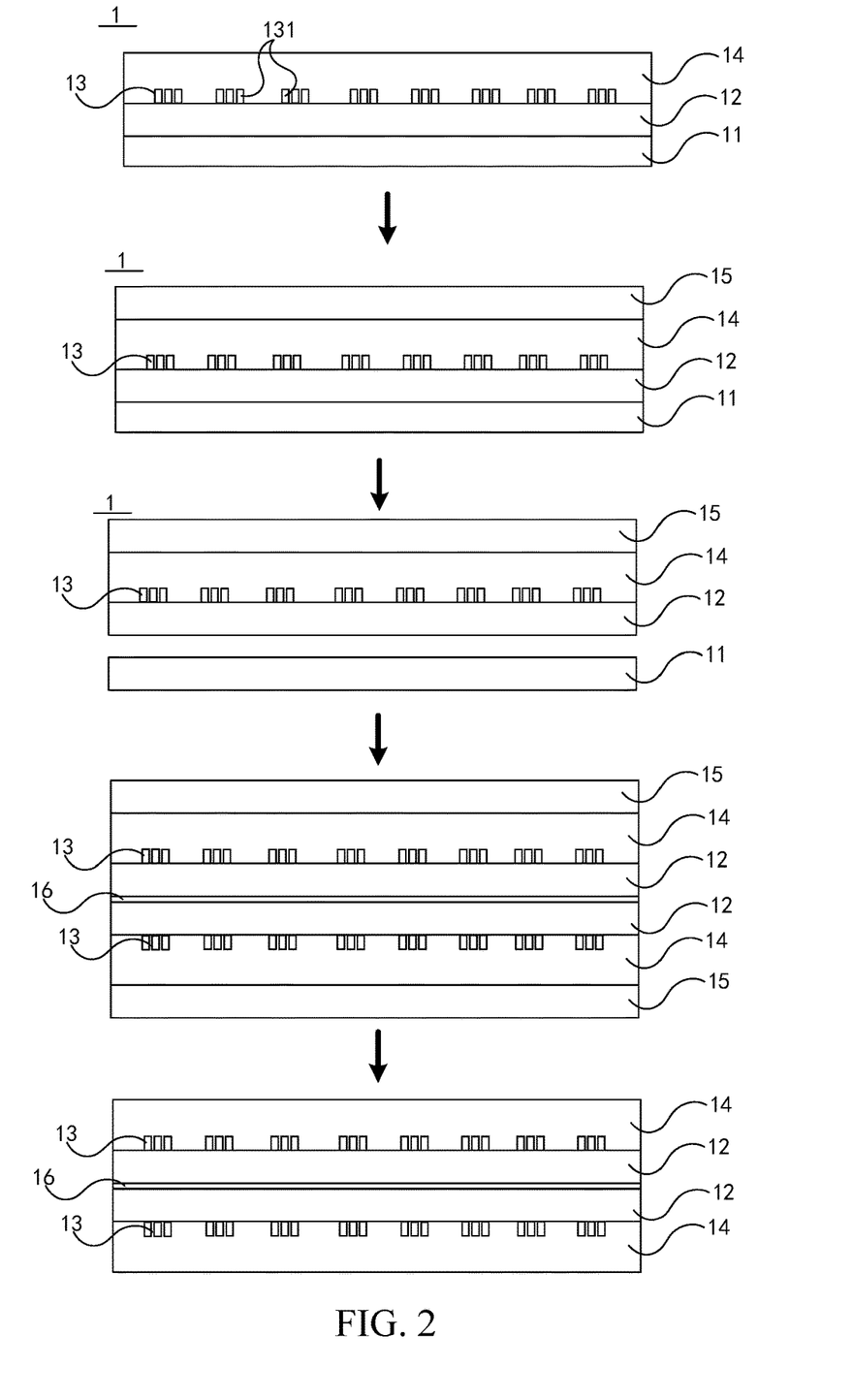
FIG. 2 is a schematic diagram of the manufacturing method of the flexible double-sided display screen according to an embodiment of the present disclosure.

In some embodiments, referring to FIG. 2, the light-emitting device layers 13 include a plurality of mini-light-emitting diode (mini-LED) chips 131. That is, the display devices 1 may be mini-LED display devices, and the flexible double-sided display screen of the present disclosure may be a flexible double-sided mini-LED display screen. Mini-light-emitting diodes are to reduce a size of conventional LED chips to a level ranging from 100 um to 300 um and have advantages of high brightness, high luminous efficiency, lightweightness, and thinness, thereby allowing the flexible double-sided display screen of the present disclosure to have advantages of flexibility, bendability, double-sided display, high brightness, high luminous efficiency, lightweightness, and thinness at a same time.

In this embodiment, the mini-light-emitting diode chips 131 may be arranged in an array. The mini-light-emitting diode chips 131 may include red mini-light-emitting diode chips that emit red light, green mini-light-emitting diode chips that emit green light, and blue mini-light-emitting diode chips that emit blue light. One red mini-light-emitting diode chip, one green mini-light-emitting diode chip, and one blue mini-light-emitting diode chip can constitute one pixel unit, thereby realizing full-color display of the flexible double-sided display screen and improving display quality of the flexible double-sided display screen.

In addition, a number of the thin film transistor units mentioned above can be same as a number of the mini-light-emitting diode chips 131, and one thin film transistor unit is connected to one mini-light-emitting diode chip 131 to realize an objective of controlling single mini-light-emitting diode chip 131, thereby realizing bright and dark display per unit area.

In this embodiment, referring to FIG. 2, the mini-light-emitting diode chips 131 of the two display devices 1 are mirror symmetry to each other. That is, the mini-light-emitting diode chips 131 of a first display device 1 is mirror symmetry to the mini-light-emitting diode chips 131 of a second display device 1 along a fitting position of the flexible substrates 12 of the two display devices 1. Then gaps between adjacent mini-light-emitting diode chips 131 of the first display device 1 would also be mirror symmetry to gaps between adjacent mini-light-emitting diode chips 131 of the second display device 1 along the fitting position of the flexible substrates 12 of the two display devices 1, and the flexible substrates 12 are transparent, thereby improving the transmittance of the flexible double-sided display screen. Therefore, the transmittance of the flexible double-sided display screen is equal to a transmittance of conventional single-sided display screens, thereby improving product quality of the flexible double-sided display screen.

Figure 4:
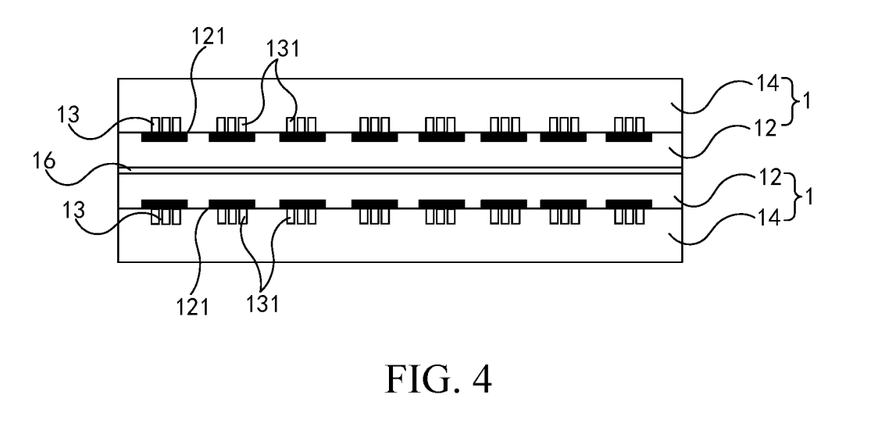
FIG. 4 is a schematic diagram of the flexible double-sided display screen according to an embodiment of the present disclosure.

In this embodiment, referring to FIG. 4, since the flexible substrates 12 are transparent, the flexible substrates 12 of the display devices 1 further include a plurality of light-shielding layers 121 disposed directly under the mini-light-emitting diode chips 131. That is, one light-shielding layer 121 can shield at least one mini-light-emitting diode chip 131, and an orthographic projection of each of the mini-light-emitting diode chips 131 on the flexible substrates 12 overlaps an orthographic projection of each of the light-shielding layers 121 on the flexible substrates 12. Therefore, there are the light-shielding layers 121 between the mini-light-emitting diode chips 131 of the two display devices 1, thereby preventing light of the two display devices 1 from affecting each other and reducing a display effect.

Figure 3:
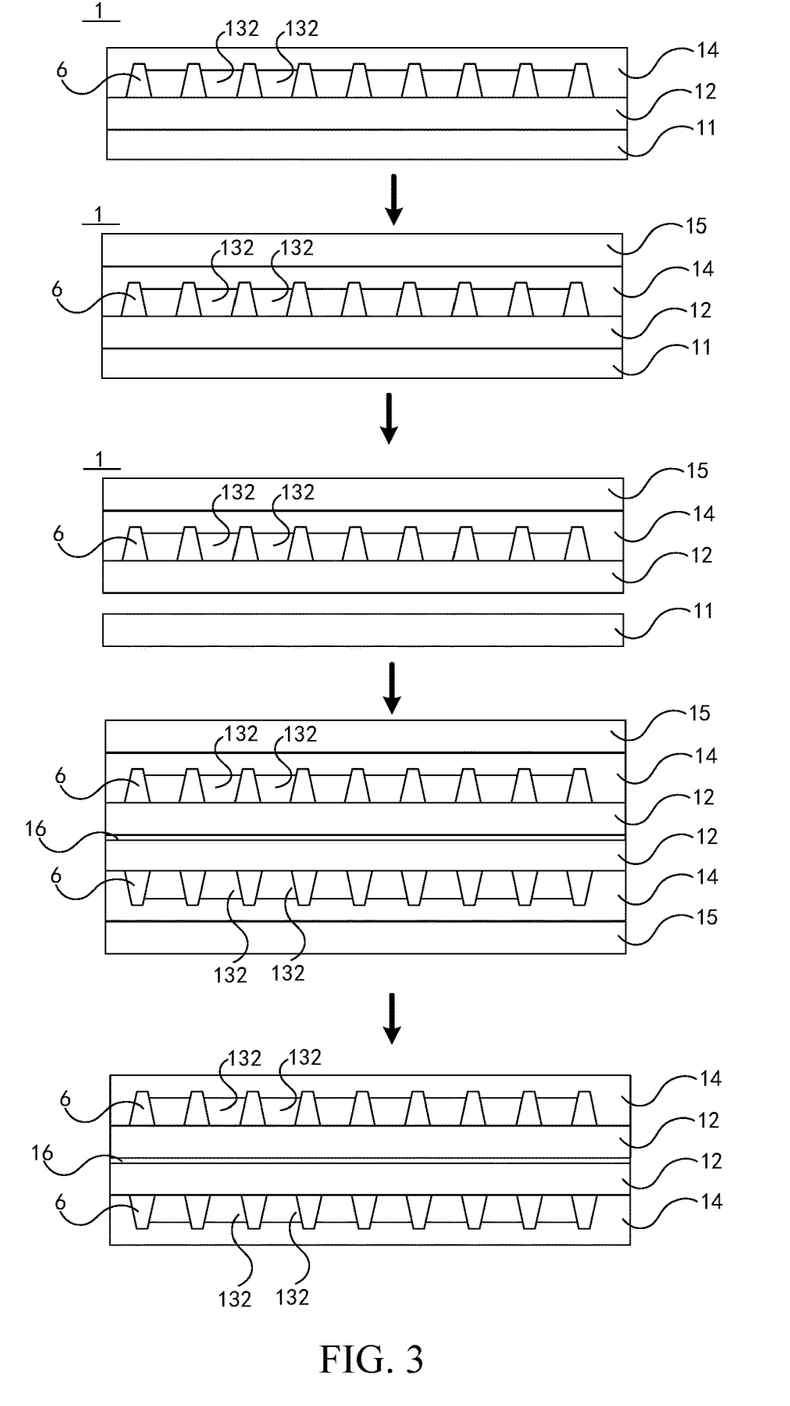
FIG. 3 is a schematic diagram of the manufacturing method of the flexible double-sided display screen according to another embodiment of the present disclosure.

In some embodiments, referring to FIG. 3, the light-emitting device layers 13 include a plurality of sub light-emitting devices 132 disposed at intervals, and each of the sub light-emitting devices 132 includes an anode layer, a cathode layer, and an organic light-emitting material layer disposed between the anode layer and the cathode layer. That is, the display devices 1 may be organic light-emitting diode (OLED) display devices, and the flexible double-sided display screen of the present disclosure may be a flexible double-sided OLED display screen. That is, the OLED display devices 1 have advantages of self-illumination, low driving voltages, high luminous efficiency, short response times, high clarity and contrast, having a viewing angle near 180 degrees, a wide range of operating temperature, and full-color display in a large area, thereby allowing the flexible double-sided display screen of the present disclosure to have flexibility, bendability, double-sided display, and the advantages mentioned above at a same time.

In this embodiment, a material of the anode layer may be indium tin oxide (ITO) or a stack of indium tin oxide/silver/indium tin oxide (ITO/Ag/ITO). The organic light-emitting material layer includes a hole injection layer disposed on the anode layer, a hole transport layer disposed on the hole injection layer, a light-emitting layer disposed on the hole transport layer, an electron transport layer disposed on the light-emitting layer, and an electron injection layer disposed on the electron transport layer. A material of the cathode layer may be metal materials, such as silver (Ag), gold (Au), aluminum (Al), or titanium (Ti).

In this embodiment, referring to FIG. 3, the sub light-emitting devices 132 may be arranged in an array. A pixel definition layer 6 may also be disposed on the flexible substrate 12, and the pixel definition layer 6 has a plurality of pixel definition areas, wherein, each of the sub light-emitting devices 132 is positioned in one of the pixel definition areas.

In addition, the number of the thin film transistor units mentioned above can be same as a number of the sub light-emitting devices 132, and one thin film transistor unit is connected to one sub light-emitting device 132 to realize an objective of controlling single sub light-emitting device 132, thereby realizing bright and dark display per unit area.

In this embodiment, referring to FIG. 3, the sub light-emitting devices 132 of the two display devices 1 are mirror symmetry to each other. That is, the sub light-emitting devices 132 of the first display device 1 is mirror symmetry to the sub light-emitting devices 132 of the second display device 1 along the fitting position of the flexible substrates 12 of the two display devices 1. Then gaps between adjacent sub light-emitting devices 132 of the first display device 1 would also be mirror symmetry to gaps between adjacent sub light-emitting devices 132 of the second display device 1 along the fitting position of the flexible substrates 12 of the two display devices 1, and the flexible substrates 12 are transparent, thereby improving the transmittance of the flexible double-sided display screen. Therefore, the transmittance of the flexible double-sided display screen is equal to the transmittance of conventional single-sided display screens, thereby improving the product quality of the flexible double-sided display screen.

Figure 5:
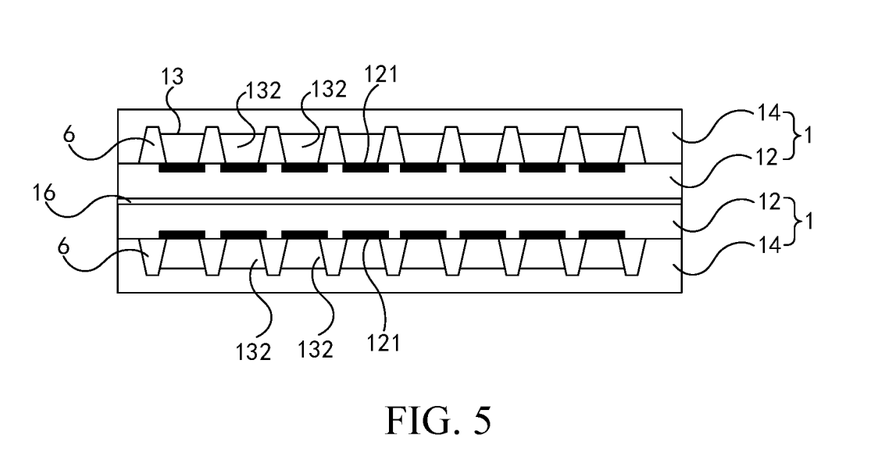
FIG. 5 is a schematic diagram of the flexible double-sided display screen according to another embodiment of the present disclosure.

In this embodiment, referring to FIG. 5, since the flexible substrates 12 are transparent, the flexible substrates 12 of the display devices 1 further include a plurality of light-shielding layers 121 disposed directly under the sub light-emitting devices 132. That is, one light-shielding layer 121 can shield at least one sub light-emitting device 132, and an orthographic projection of each of the sub light-emitting devices 132 on the flexible substrates 12 overlaps an orthographic projection of each of the light-shielding layers 121 on the flexible substrates 12. Therefore, there are the light-shielding layers 121 between the sub light-emitting devices 132 of the two display devices 1, thereby preventing light of the two display devices 1 from affecting each other and reducing the display effect.

In some embodiments, referring to FIGS. 2 and 3, in the step S4, the step of attaching the flexible substrates 12 of the two display devices 1 together includes a following step: attaching the flexible substrates 12 of the two display devices 1 together by an optical adhesive 16. The optical adhesive 16 has a high transmittance (above 95%), thereby improving the transmittance of the flexible double-sided display screen and improving the product quality of the flexible double-sided display screen. Of course, other adhesives may also be used to attach the flexible substrates 12 of the two display devices 1 together, such as thermal-sensitive adhesives, which is not limited herein.

In some embodiments, in the step S3, the step of stripping off the first support plates 11 of the two display devices 1 includes a following step: stripping off the first support plates 11 of the two display devices 1 by a laser lift-off process. The laser lift-off process is to irradiate a position between the first support plates 11 and the flexible substrates 12 with a pulsed laser, thereby ablating the first support plates 11 and/or the flexible substrates 12 to peel off the first support plates 11 from the flexible substrates 12. Compared with chemical lift-off or mechanical lift-off, the laser lift-off technique has characteristics of high energy input efficiency and small damages to devices, which can reduce damages to the flexible substrates 12.

In some embodiments, in the step S5, the step of stripping off the two second support plates 15 of the two display devices 1 includes a following step: stripping off the two second support plates 15 of the two display devices 1 by the laser lift-off process. The laser lift-off process is to irradiate a position between the second support plates 15 and the encapsulation layers 14 with the pulsed laser, thereby ablating the second support plates 15 and/or the encapsulation layers 14 to peel off the second support plates 15 from the encapsulation layers 14. Compared with chemical lift-off or mechanical lift-off, the laser lift-off technique has the characteristics of high energy input efficiency and small damages to devices, which can reduce damages to the encapsulation layers 14.

Referring to FIGS. 4 and 5, based on the manufacturing method of the flexible double-sided display screen mentioned above, an embodiment of the present disclosure further provides the flexible double-sided display screen, which includes the two display devices 1.

Each of the two display devices 1 includes the flexible substrate 12, the light-emitting device layer 13 disposed on the flexible substrate 12, and the encapsulation layer 14 disposed on the flexible substrate 12 and the light-emitting device layer 13; and flexible substrates 12 of the two display devices 1 are attached to each other.

It should be noted that the flexible double-sided display screen does not have the first support plates 11 and second support plates 15, thereby having flexibility, and the thickness and costs of the flexible double-sided display screen can be reduced. In addition, the light-emitting direction of each display device 1 is the direction away from the flexible substrate 12, that is, each display device 1 emits light to the direction away from the flexible substrate 12. The present disclosure can allow the light-emitting direction of the two display devices 1 to face away each other by attaching the flexible substrates 12 of the two display devices 1 together, thereby realizing double-sided display.

In some embodiments, the optical adhesive 16 may be used to attach the flexible substrates 12 of the two display devices 1 together. The optical adhesive 16 has a high transmittance (above 95%), thereby improving the transmittance of the flexible double-sided display screen and improving the product quality of the flexible double-sided display screen. Of course, other adhesives may also be used to attach the flexible substrates 12 of the two display devices 1 together, such as thermal-sensitive adhesives, which is not limited herein.

In the above embodiments, the description of each embodiment has its own emphasis. For the parts that are not described in detail in an embodiment, can refer to the detailed description of other embodiments above. In specific implementation, each of the above units or structures can be implemented as independent entities, or can be combined arbitrarily to be implemented as the same or several entities. The specific implementation of each of the above units or structures can be referred to the previous method embodiments, and will not be repeated here.

The flexible double-sided display screen and the manufacturing method thereof provided in the embodiments of the present disclosure are described in detail above. Specific examples are used herein to explain the principles and implementation of the present disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A manufacturing method of a flexible double-sided display screen, comprising following steps:
providing two display devices, wherein each of the two display devices comprises a first support plate, a flexible substrate disposed on the first support plate, a light-emitting device layer disposed on the flexible substrate, and an encapsulation layer disposed on the flexible substrate and the light-emitting device layer, the light-emitting device layer comprises a plurality of sub light-emitting devices disposed at intervals, and a plurality of light-shielding layers are disposed between the flexible substrate and the light-emitting device layer, the plurality of the light-shielding layers are disposed at intervals and correspond one-to-one to the plurality of the sub light-emitting devices, and an orthogonal projection of each of the sub light-emitting devices on the flexible substrate is located within an orthogonal projection of a corresponding one of the light-shielding layers on the flexible substrate;
attaching two second support plates onto encapsulation layers of the two display devices, respectively;
stripping off first support plates of the two display devices;
attaching flexible substrates of the two display devices together; and
stripping off the two second support plates of the two display devices.

2. The manufacturing method of the flexible double-sided display screen according to claim 1, wherein before attaching the flexible substrates of the two display devices together, the manufacturing method further comprises following steps:
manufacturing at least one alignment mark on each of the two second support plates; and
aligning the at least one alignment mark of the two second support plates.

3. The manufacturing method of the flexible double-sided display screen according to claim 1, wherein the plurality of the sub light-emitting devices are a plurality of mini-light-emitting diode chips.

4. The manufacturing method of the flexible double-sided display screen according to claim 3, wherein the mini-light-emitting diode chips of the two display devices are mirror symmetry to each other.

5. The manufacturing method of the flexible double-sided display screen according to claim 1, wherein each of the sub light-emitting devices comprises an anode layer, a cathode layer, and an organic light-emitting material layer disposed between the anode layer and the cathode layer.

6. The manufacturing method of the flexible double-sided display screen according to claim 5, wherein the sub light-emitting devices of the two display devices are mirror symmetry to each other.

7. The manufacturing method of the flexible double-sided display screen according to claim 1, wherein the step of attaching the flexible substrates of the two display devices together comprises a following step:
attaching the flexible substrates of the two display devices together by an optical adhesive.

8. The manufacturing method of the flexible double-sided display screen according to claim 1, wherein the step of stripping off the first support plates of the two display devices comprises a following step:

stripping off the first support plates of the two display devices by a laser lift-off process.

9. The manufacturing method of the flexible double-sided display screen according to claim 1, wherein the step of stripping off the two second support plates of the two display devices comprises a following step:
    stripping off the two second support plates of the two display devices by a laser lift-off process.

10. A flexible double-sided display screen, comprising two display devices;
    wherein each of the two display devices comprises a flexible substrate, a light-emitting device layer disposed on the flexible substrate, and an encapsulation layer disposed on the flexible substrate and the light-emitting device layer; and
    flexible substrates of the two display devices are attached to each other;
    wherein the light-emitting device layer comprises a plurality of sub light-emitting devices disposed at intervals, and a plurality of light-shielding layers are disposed between the flexible substrate and the light-emitting device layer, the plurality of the light-shielding layers are disposed at intervals and correspond one-to-one to the plurality of the sub light-emitting devices, and an orthogonal projection of each of the sub light-emitting devices on the flexible substrate is located within an orthogonal projection of a corresponding one of the light-shielding layers on the flexible substrate.

11. A manufacturing method of a flexible double-sided display screen, comprising following steps:
    providing two display devices, wherein each of the two display devices comprises a first support plate, a flexible substrate disposed on the first support plate, a light-emitting device layer disposed on the flexible substrate, and an encapsulation layer disposed on the flexible substrate and the light-emitting device layer, the light-emitting device layer comprises a plurality of sub light-emitting devices disposed at intervals, and a plurality of light-shielding layers are disposed between the flexible substrate and the light-emitting device layer, the plurality of the light-shielding layers are disposed at intervals and correspond one-to-one to the plurality of the sub light-emitting devices, and an orthogonal projection of each of the sub light-emitting devices on the flexible substrate is located within an orthogonal projection of a corresponding one of the light-shielding layers on the flexible substrate;
    attaching two second support plates onto encapsulation layers of the two display devices, respectively;
    stripping off first support plates of the two display devices by a laser lift-off process;
    attaching flexible substrates of the two display devices together; and
    stripping off the two second support plates of the two display devices by the laser lift-off process.

12. The manufacturing method of the flexible double-sided display screen according to claim 11, wherein before attaching the flexible substrates of the two display devices together, the manufacturing method further comprises following steps:
    manufacturing at least one alignment mark on each of the two second support plates; and
    aligning the at least one alignment mark of the two second support plates.

13. The manufacturing method of the flexible double-sided display screen according to claim 11, wherein the plurality of the sub light-emitting devices are a plurality of mini-light-emitting diode chips.

14. The manufacturing method of the flexible double-sided display screen according to claim 13, wherein the mini-light-emitting diode chips of the two display devices are mirror symmetry to each other.

15. The manufacturing method of the flexible double-sided display screen according to claim 11, wherein each of the sub light-emitting devices comprises an anode layer, a cathode layer, and an organic light-emitting material layer disposed between the anode layer and the cathode layer.

16. The manufacturing method of the flexible double-sided display screen according to claim 15, wherein the sub light-emitting devices of the two display devices are mirror symmetry to each other.

* * * * *